(12) United States Patent
Rakshit et al.

(10) Patent No.: US 11,348,629 B2
(45) Date of Patent: *May 31, 2022

(54) GIANT SPIN HALL-BASED COMPACT NEUROMORPHIC CELL OPTIMIZED FOR DIFFERENTIAL READ INFERENCE

(71) Applicant: Samsung Electronics Co., Ltd., Suwon-si (KR)

(72) Inventors: Titash Rakshit, Austin, TX (US); Ryan Hatcher, Austin, TX (US); Jorge A. Kittl, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 77 days.

This patent is subject to a terminal disclaimer.

(21) Appl. No.: 17/000,009

(22) Filed: Aug. 21, 2020

(65) Prior Publication Data

US 2020/0388314 A1  Dec. 10, 2020

Related U.S. Application Data

(63) Continuation of application No. 16/290,715, filed on Mar. 1, 2019, now Pat. No. 10,790,002.

(Continued)

(51) Int. Cl.
*G11C 11/16* (2006.01)
*H01L 43/06* (2006.01)
(Continued)

(52) U.S. Cl.
CPC .......... *G11C 11/1675* (2013.01); *G06F 7/50* (2013.01); *G06N 3/063* (2013.01);
(Continued)

(58) Field of Classification Search
CPC .......................... G11C 11/15; G11C 11/1675
(Continued)

(56) References Cited

U.S. PATENT DOCUMENTS

| 5,691,934 A | 11/1997 | Douglass |
| 6,351,410 B1 | 2/2002 | Nakao et al. |

(Continued)

FOREIGN PATENT DOCUMENTS

| WO | WO2014204492 A1 | 12/2014 |
| WO | 2015/116416 A1 | 8/2015 |
| WO | 2018/106212 A1 | 6/2018 |

OTHER PUBLICATIONS

Seow, Kian Chiew, "Commercialization of Germanium Based Nanocrystal Memory", Thesis Submitted to the Deparlment of Material Science and Engineering, Massachusetts Institute of Technology, Sep. 2007, (100 pages).

(Continued)

*Primary Examiner* — Anthan Tran
(74) *Attorney, Agent, or Firm* — Lewis Roca Rothgerber Christie LLP

(57) ABSTRACT

A non-volatile data retention circuit includes a complementary latch configured to generate and store complementary non-volatile spin states corresponding to an input signal when in a write mode, and to concurrently generate a first charge current signal and a second charge current corresponding to the complementary non-volatile spin states when in read mode, and a differential amplifier coupled to the complementary latch and configured to generate an output signal based on the first and second charge current signals.

20 Claims, 5 Drawing Sheets

Related U.S. Application Data

(60) Provisional application No. 62/688,102, filed on Jun. 21, 2018.

(51) Int. Cl.
*H01L 43/04* (2006.01)
*G06N 3/063* (2006.01)
*G06F 7/50* (2006.01)
*H01L 43/10* (2006.01)
*H01L 43/08* (2006.01)

(52) U.S. Cl.
CPC .......... *G11C 11/1673* (2013.01); *H01L 43/04* (2013.01); *H01L 43/06* (2013.01); *H01L 43/08* (2013.01); *H01L 43/10* (2013.01); *G06F 2207/4824* (2013.01)

(58) Field of Classification Search
USPC ........................................................ 365/158
See application file for complete search history.

(56) References Cited

U.S. PATENT DOCUMENTS

| | | | |
|---|---|---|---|
| 6,879,512 B2 | 4/2005 | Luo | |
| 7,582,941 B2 | 9/2009 | Cho et al. | |
| 7,933,137 B2 | 4/2011 | Dimitrov et al. | |
| 8,125,040 B2 | 2/2012 | Kang et al. | |
| 8,514,605 B2 | 8/2013 | Chen et al. | |
| 8,630,145 B2 | 1/2014 | Sandhu | |
| 8,812,414 B2 | 8/2014 | Arthur et al. | |
| 8,830,725 B2 | 9/2014 | Bethune et al. | |
| 8,841,739 B2 | 9/2014 | Khalili Amiri et al. | |
| 9,117,521 B2 | 8/2015 | Guillemenet et al. | |
| 9,130,155 B2 | 9/2015 | Chepulskyy et al. | |
| 9,230,626 B2 | 1/2016 | Buhrman et al. | |
| 9,240,799 B1 | 1/2016 | Wang et al. | |
| 9,251,883 B2 | 2/2016 | Wu et al. | |
| 9,343,658 B2 | 5/2016 | Wang et al. | |
| 9,368,581 B2 | 6/2016 | Sandhu | |
| 9,589,619 B2 | 3/2017 | Lee et al. | |
| 9,858,975 B1 | 1/2018 | Hatcher | |
| 9,864,950 B2 | 1/2018 | Datta et al. | |
| 10,790,002 B2 * | 9/2020 | Rakshit | H01L 43/10 |
| 2003/0174530 A1 | 9/2003 | Tran | |
| 2008/0273365 A1 | 11/2008 | Kang et al. | |
| 2009/0046501 A1 | 2/2009 | Ranjan et al. | |
| 2009/0161265 A1 | 6/2009 | Sugano et al. | |
| 2009/0218600 A1 | 9/2009 | Park et al. | |
| 2010/0097852 A1 | 4/2010 | Chen et al. | |
| 2012/0075906 A1 | 3/2012 | Ho et al. | |
| 2013/0223125 A1 | 8/2013 | DeBrosse et al. | |
| 2014/0124882 A1 | 5/2014 | Khalili Amiri et al. | |
| 2014/0149773 A1 | 5/2014 | Huang et al. | |
| 2014/0313834 A1 | 10/2014 | Fisch et al. | |
| 2014/0340957 A1 | 11/2014 | Wang | |
| 2015/0036415 A1 | 2/2015 | Di Pendina et al. | |
| 2015/0070981 A1 | 3/2015 | Kumura | |
| 2015/0145576 A1 | 5/2015 | Wu et al. | |
| 2015/0213868 A1 | 7/2015 | Wu et al. | |
| 2016/0071582 A1 | 3/2016 | Chung | |
| 2016/0225423 A1 | 8/2016 | Naik et al. | |
| 2017/0200499 A1 * | 7/2017 | Rakshit | G11C 14/0081 |
| 2017/0330070 A1 | 11/2017 | Sengupta et al. | |
| 2017/0331484 A1 | 11/2017 | Kudo | |

OTHER PUBLICATIONS

Pan, Xiang and Teodorescu, Radu, "NVSleep: Using Non-Volatile Memory to Enable Fast SleepNVakeup of Idle Cores", Department of Computer Science and Engineering, The Ohio State University, Columbus, OH, Computer Design (ICCD), 2014 32nd IEEE International Conference on IEEE, 2014. (url: http://web.cse.ohiostate.edu/—teodores/resources/papers/nvsleep_iccd14.pdf) (8 pages).

Sharad, Mrigank and Roy, Kaushik, "Exploring Ultra Low-Power on-Chip Clocking Using Functionality Enhanced Spin-Torque Switches", Department of Electrical and Computer Engineering, Purdue University, West Lafayette, IN, http://arxiv.org/pdf/1401.0015 (5 pages).

Liu, L., et al., Spin-Torque Switching with the Giant Spin Hall effect of Tantalum, Science, May 4, 2012: vol. 336, No. 6081, pp. 555-558.

Van Den Brink, A., et al., Field-free magnetization reversal by Spin Hall effect and exchange bias, Nature Communications, Mar. 4, 2016, 7 pages.

* cited by examiner

GIANT SPIN HALL-BASED COMPACT NEUROMORPHIC CELL OPTIMIZED FOR DIFFERENTIAL READ INFERENCE

CROSS-REFERENCE TO RELATED APPLICATION(S)

This application is a continuation of U.S. patent application Ser. No. 16/290,715, filed Mar. 1, 2019, which claims the benefit and the priority of U.S. Provisional Patent Application No. 62/688,102 filed Jun. 21, 2018, the entire content of which is incorporated herein by reference.

This application is also related to U.S. Pat. No. 9,805,795 ("ZERO LEAKAGE, HIGH NOISE MARGIN COUPLED GIANT SPIN HALL BASED"), issued on Oct. 31, 2017, and U.S. Pat. No. 9,858,975 ("ZERO TRANSISTOR TRANSVERSE CURRENT BI-DIRECTIONAL BIT-CELL"), issued on Jan. 2, 2018, the entire contents of which are incorporated herein by reference.

FIELD

Aspects of the present invention relate to the field of data retention and process devices.

BACKGROUND

In recent years, the field neuromorphic computing has attempted to mimic the neuro-biological architectures in the nervous system, which are responsible for perception, motor control, sensory integration, etc., using analog, digital, and/or mixed-mode electronics and software systems. Neuromorphic chips, which are the hardware implementation of neuromorphic computing, include a plurality of neuromorphic cells that simulate synapses in the brain by encoding and sending data in a series of electrical bursts. This is in contrast to present computers that generally have a linear architecture for processing data that transmits information back and forth between a central processing unit (CPU) and memory chips.

While a neuromorphic chip may not be as powerful or flexible as a general purpose chip, the neuromorphic chip may be specialized to perform a specific task in a faster and more energy efficient manner than a general purpose chip. Neuromorphic chips and their constituent neuromorphic cells are of great interest in the fields of machine learning and artificial intelligence. In a neuromorphic cell, information is learned in the form of weight values stored in one or more memory units. This information may be stored in complementary form and read differentially to minimize or reduce noise. However, the storage of complementary information may increase the area and power consumption of the neuromorphic cell, and hence the neuromorphic chip.

The above information disclosed in this Background section is only for enhancement of understanding of the background of the invention, and therefore it may contain information that does not form the prior art that is already known to a person of ordinary skill in the art.

SUMMARY

Aspect of embodiments of the present invention are directed to a compact cell with a differential read circuit, which may be utilized as a neuromorphic weight cell, that includes a Coupled Giant Spin Hall Latch (CGSHL) with two concurrently programmed resistances, Rp and Rn, a current mirror and a differential amplifier. Some embodiments of the present invention utilize unique properties of Giant Spin Hall based devices that may be used to simultaneously write 0/1 or 1/0 bit pairs, thus automatically creating a copy of a weight value. Accordingly, some embodiments of the present invention save area and power and may be very useful in a dense neuromorphic circuit implementation.

According to some embodiments of the present invention, there is provided a non-volatile data retention circuit including: a complementary latch configured to generate and store complementary non-volatile spin states corresponding to an input signal when in a write mode, and to concurrently generate a first charge current signal and a second charge current corresponding to the complementary non-volatile spin states when in read mode; and a differential amplifier coupled to the complementary latch and configured to generate an output signal based on the first and second charge current signals.

In some embodiments, the non-volatile data retention circuit further includes: a current mirror coupled between the complementary latch and the differential amplifier, and configured to receive the second charge current and to supply a reverse current to the differential amplifier, the reverse current having a polarity that is the reverse of that of the second charge current.

In some embodiments, the differential amplifier is a current sense amplifier.

In some embodiments, the complementary latch includes: a giant spin hall metal configured to pass through a charge current corresponding to the input signal; a first spin transfer torque (STT) stack at a first side of the giant spin hall metal; and a second STT stack at a second side of the giant spin hall metal opposite to the first side, wherein the first and second STT stacks extend along a direction orthogonal to an extension direction of the giant spin hall metal, and are configured to generate and store the complementary non-volatile spin states.

In some embodiments, in response to the charge current flowing through the giant spin hall metal, the first STT stack is configured to exhibit magnetic moments having a parallel configuration, and the second STT stack is configured to exhibit magnetic moments having an anti-parallel configuration, and wherein the first and second STT stacks are configured to maintain their parallel and anti-parallel configurations even when no power is provided to the non-volatile data retention circuit.

In some embodiments, the parallel configuration of the first STT stack and the anti-parallel configuration of the second STT stack correspond to storage of the complementary non-volatile spin states at the first and second STT stacks.

In some embodiments, the giant spin hall metal includes beta tantalum, platinum, and/or copper bismuth.

In some embodiments, each of the first and second STT stacks include: a free layer including magnetic material and configured to respond to a spin current corresponding to the charge current flowing through the giant spin hall metal based on a giant spin hall effect, and to exhibit a free magnetic moment substantially orthogonal in direction to the spin current; a fixed layer including magnetic material and exhibiting a fixed magnetic moment unaffected by stray fields resulting from the charge current flowing through the giant spin hall metal; and a non-magnetic layer between the free and fixed layers and configured to magnetically isolate the free magnetic moment of the free layer from the fixed magnetic moment of the fixed layer and to maintain any existing difference in directionality of the free and fixed magnetic moments.

In some embodiments, in response to the charge current flowing through the giant spin hall metal, the free layer of the first STT stack is configured to exhibit a first free magnetic moment parallel with the fixed magnetic moment of the corresponding fixed layer, and the free layer of the second STT stack is configured to exhibit a second free magnetic moment anti-parallel with the fixed magnetic moment of the corresponding fixed layer.

In some embodiments, the non-volatile data retention circuit further includes: a first transistor coupled to the giant spin hall metal and configured to activate in response to a first selection signal; and a second transistor coupled to the giant spin hall metal and configured to activate in response to a second selection signal, wherein, when in write mode, the first and second transistors are configured to activate and to enable flow of the charge current through the giant spin hall metal in response to the first and second selection signals, and wherein, when in read mode, the second transistor is configured to deactivate, and the first transistor is configured to activate and to enable flow of a first charge current through the first STT stack and a second charge current through the second STT stack in response to the first selection signal.

In some embodiments, the first and second transistors are coupled to opposite ends of the giant spin hall metal, and the second transistor is configured to electrically couple the giant spin hall metal to a pull down resistor in response to the second selection signal.

In some embodiments, the differential amplifier includes a first input configured to receive a first charge current from the first STT stack, and a second input configured to receive a second charge current from the second STT stack.

In some embodiments, the non-volatile data retention circuit further includes a current mirror coupled between the second STT stack and the differential amplifier, and configured to receive the second charge current and to supply a reverse current to the differential amplifier, the reverse current having a polarity that is the reverse of that of the second charge current.

In some embodiments, the complementary latch is configured to continue storing the complementary non-volatile spin states even when no electrical power is provided to the non-volatile data retention circuit.

In some embodiments, the differential amplifier is directly coupled to opposite ends of the complementary latch through first and second bits lines and configured to receive the first and second charge current signals through the first and second bits lines.

According to some embodiments of the present invention, there is provided a data processing system including: a first complementary latch configured to generate and store first complementary non-volatile spin states corresponding to a first input signal when in a write mode, and to concurrently generate a first charge current signal and a second charge current corresponding to the first complementary non-volatile spin states when in a read mode; a second complementary latch configured to generate and store second complementary non-volatile spin states corresponding to a second input signal when in the write mode, and to concurrently generate a third charge current signal and a fourth charge current corresponding to the second complementary non-volatile spin states when in the read mode; and a differential amplifier coupled to the first and second complementary latches and configured to generate an output signal based on the first to fourth charge current signals.

In some embodiments, a first input of the differential amplifier is configured to receive a sum of the first and third charge currents from the first and second complementary latches.

In some embodiments, the data processing system further including: a current mirror coupled between the first and second complementary latches and the differential amplifier, and configured to receive the second and fourth charge currents and to supply a reverse current to the differential amplifier, the reverse current having a polarity that is the reverse of that of the second and fourth charge currents.

In some embodiments, the reverse current corresponds to a sum of the second and fourth charge currents.

According to some embodiments of the present invention, there is provided a method of writing complementary volatile charge states of a data retention circuit, the method including: receiving a first selection signal and a second selection signal, the first and second selection signals being indicative of a data write operation; and in response to receiving the first and second selection signals: receiving an input signal at an input of the data retention circuit; coupling, via a first transistor and a second transistor, opposite ends of a giant spin hall metal of a coupled giant spin hall latch to the input of the data retention circuit and to a pull down resistor to receive a charge current from the input through the giant spin hall metal; and generating and storing, by the coupled giant spin hall latch, complementary non-volatile spin states corresponding to the input signal in response to receiving the charge current from the input.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1:
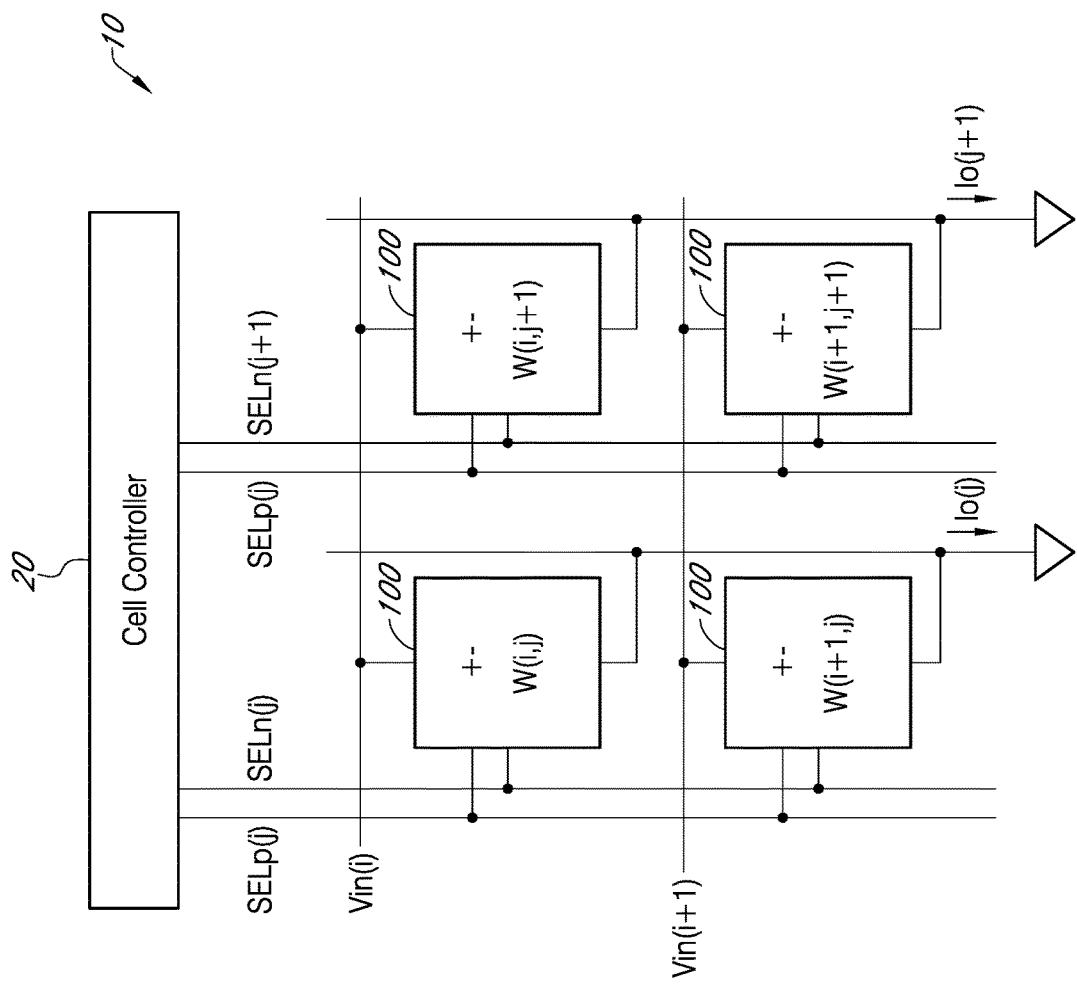
FIG. 1 is a schematic diagram of a data processing system utilizing a non-volatile data retention circuit, according to some example embodiments of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Descriptions of features or aspects within each exemplary embodiment should typically be considered as available for other similar features or aspects in other exemplary embodiments. Like reference numerals designate like elements throughout the specification.

Some example embodiments of the present invention enable efficient, low noise margin, differential read for inference based off a neuromorphic cell. In some embodiments, this is achieved by storing a bit (e.g., a '1') and its complementary bit (e.g., '0') as resistance values in Coupled Giant Spin Hall Latch (CGSHL), and sensing the difference in resistance between these stored bits for a very low noise reading.

FIG. 1 is a schematic diagram of a data processing system 10 utilizing a non-volatile data retention circuit 100, according to some example embodiments of the present invention.

Referring to FIG. 1, the data processing system 10 stores and processes data. In some examples, the data processing system 10 may be a node (e.g., a neuromorphic cell or "synapse") within an artificial intelligence (AI) system (e.g., a neuromorphic chip). The data process system 10 multiplies an input signal by a value (also referred to as a weight) to produce an output signal.

According to some embodiments, the data process system 10 includes a plurality of a non-volatile data retention circuits 100, each of which acts as a latch for storing complementary states of non-volatile data. The non-volatile data retention circuits 100 enables a zero- (or near zero-) leakage retention of latched data when idle, that is, when the latched data is not subject to a read or write request, such as may be the case when the electronic device that the data processing system 10 is part of is powered down (e.g., is powered off or is in sleep/hibernation mode). According to some embodiments, the non-volatile data retention circuit 100 uses the Giant Spin Hall effect to convert the an input signal (e.g., an input voltage/current signal) to complementary spin states that correspond to (e.g., represent) complimentary bit data. When retrieving the stored complementary states (e.g., when generating an output signal based on an input signal and the latched data), the non-volatile data retention circuit 100 converts the stored complementary spin states to complementary charge states for further processing.

According to some embodiments, each non-volatile data retention circuit 100 receives first and second control signals (also referred to as selections signals) SELp and SELn, which control the data write and read operations of the non-volatile data retention circuit 100. In some embodiments, the first and second selection signals SELp and SELn are supplied from a cell controller 20 that controls operations of a plurality of non-volatile data retention circuits 100, which are organized in matrix form along columns and rows. According to some embodiments, the non-volatile data retention circuits 100 along a jth column (where j is an integer greater than zero) share common first and second selection signals SELp(j) and SELn(j), and their output signals are summed together (to, e.g., amount to the output currents Io(j) and Io(j+1) shown in FIG. 1). In some embodiments, each non-volatile data retention circuit 100 generates a current signal at its output, and the output signals of the non-volatile data retention circuits 100 in a particular column are added together by tying together (i.e., electrically connecting) their outputs. Those of the non-volatile data retention circuits 100 arranged along an ith row (where i is an integer greater than zero) share a common input signal Vin(i). In some examples, the input signal Vin(i) may be an output signal of a previous node (e.g., a neuromorphic cell from a previous stage).

As will be recognized by person of ordinary skill in the art, while only four data retention circuits 100 are illustrated in FIG. 1, embodiments of the invention are not limited thereto, and the data process system 10 may include any suitable number of data retention circuits 100. Further, the illustrated data retention circuits 100 represent weight components W(i, j), W(i, j+1), W(i+1, j), and W(i+1, j+1) of a cell value (or node weight), which may or may not have other components.

Figure 2:
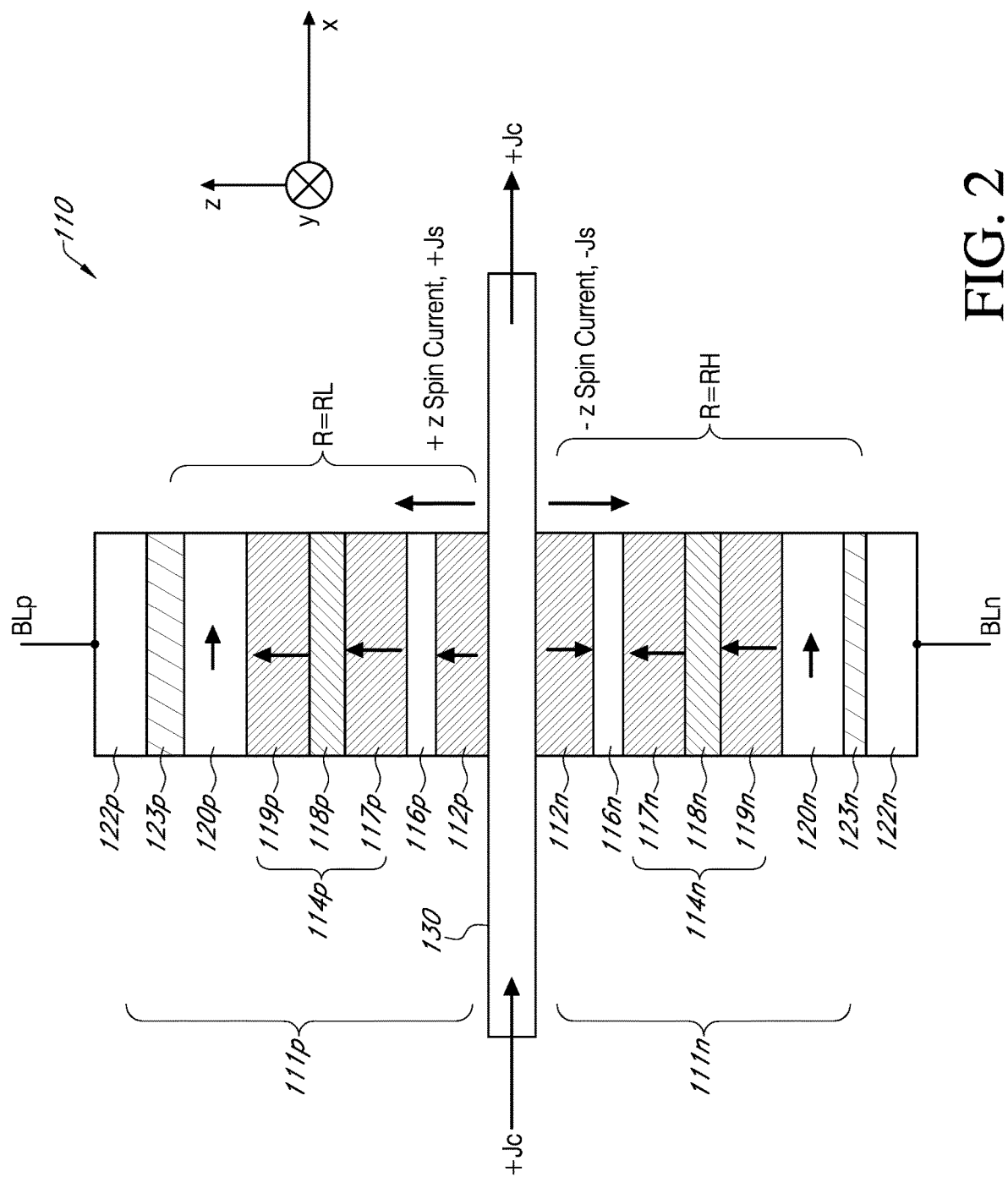
FIG. 2 is a schematic diagram of a complementary latch of a non-volatile, high noise-margin, data retention circuit, according to some example embodiments of the present invention.

FIG. 2 is a schematic diagram of a complementary latch 110 of a non-volatile, high noise-margin, data retention circuit 100, according to some embodiments of the present invention.

According to some embodiments, the non-volatile data retention circuit 100 includes a complementary latch (e.g., a coupled giant spin hall latch) 110 that uses dual Spin Transfer Torque (STT) stacks to store complementary data. The dual STT stacks include first and second STT stacks 111$p$ and 111$n$ on opposite sides (e.g., in opposite Z directions) of, and adjacent to, a Giant Spin Hall metal 130, which is a metal, such as beta tantalum, platinum, copper bismuth (CuBi), and/or the like. The two stacks of STT devices 111$p$ and 111$n$ along with the Giant Spin Hall metal 130 may also be referred to as a Coupled Giant Spin Hall Latch (CGSHL). The passage of charge current through the Giant Spin Hall metal 130 induces the concurrent (e.g., simultaneous) storage of complementary binary '0'/'1' or '1'/'0' states in the first and second STT stacks 111$p$ and 111$n$ in the form of complementary non-volatile spin states, as a result of the Giant Spin Hall effect.

According to some embodiments, each of the first and second STT stacks 111$p$/111$n$ includes a free layer 112$p$/112$n$ adjacent to the Giant Spin Hall metal 130, a fixed layer 114$p$/114$n$, and a nonmagnetic tunneling barrier layer 116$a$/116$b$, such as crystalline magnesium oxide (MgO), amorphous aluminum oxide, and/or the like separating the free and fixed layers 112$p$/112$n$ and 114$p$/114$n$.

The free layer 112$p$/112$n$ and the fixed layer 114$p$/114$n$ are magnetic. According to some embodiments, the magnetic moments (e.g., the fixed magnetic moments) of the fixed layers 114$p$ and 114$n$ are collinear and pinned in a particular direction, for example, the Z direction shown in FIG. 2, which is parallel or substantially parallel to the height direction of the first and second STT stacks 111$p$ and 111$n$. The magnetic moments may be fixed through an exchange-bias interaction with an antiferromagnetic (AFM) layer. In some examples, the fixed layer 114$p$/114$n$ may include a plurality of layers. For example, the fixed layer 114$p$/114$n$ may include an antiferomagentic layer 118$p$/118$n$ between two fixed ferromagnetic layers 117$p$/117$n$ and 119$p$/119$n$. The antiferromagnetic layer 118 is an intermediate layer, which mediates antiferromagnetic coupling between the fixed ferromagnetic layers 117$p$/n and 119$p$/n. This may aid couple the fixed ferromagnetic layers 117$p$/n to 119$p$/n and make a stronger fixed layer 114$p$/n. In some examples, the antiferromagnetic layer 118 may include Ruthenium (Ru). According to some embodiments, a symmetry breaking layer 120$p$/120$n$ is positioned over the fixed layers 114$p$ and 114$n$ to enable perpendicular spin torque operation, which is desirable for the scaled area of the STT structures. A capping layer 123$p$/123$n$ may cover the symmetry breaking layer 120$p$/120$n$ to protect the layers beneath it, and an electrode layer 122$p$/122$n$ may be positioned above the capping layer 123$p$/123$n$ to enable an electrical connection between the STT stack 111$p$/111$n$ and outside circuity (e.g., a differential amplifier or current mirror) through a bitline BLp/BLn.

As charge current passes through the Giant Spin Hall metal 130 (e.g., along the X direction), a flow of spin current is generated in an orthogonal direction (e.g., +/−Z direction) that provides a torque that flips the magnetic moment in a direction (e.g., in a +/−Y direction) that is transverse to the direction of charge current flow. The resulting spin current then may switch the magnetic orientation of the adjacent first and second free layers 112p and 112n as a result of the Giant Spin Hall effect. The first and second free layers 112p and 112n may include iron (Fe), a cobalt iron alloy (e.g., CoFe), a cobalt iron boron alloy (e.g., CoFeB), and/or the like. As the first and second free layers 112p and 112n are on opposing sides of the Giant Spin Hall metal 130, the magnetic orientations of the first free layer 112p may be the opposite of that of the second free layer 112n (e.g., one is in −Z direction, while the other is in +Z direction). According to some embodiments, the magnetic orientation of the fixed layer 114p/114n is fixed and is immune to and not affected by (or not substantially affected by) the stray fields resulting from the charge current flow through the Giant Spin Hall metal 130. The nonmagnetic tunneling barrier layer 116a/116b serves to magnetically isolate the magnetic moment (e.g., free magnetic moment) of the free layer 112p/112n from the fixed magnetic moment of the fixed layer 114p/114n and to maintain any existing difference in directionality of the free and fixed magnetic moments (i.e., prevent the fixed magnetic moment of the fixed layer 114p/114n from influencing and changing the directionality of the free magnetic moment of the free layers 112p/112n). In embodiments in which the magnetic moments of the fixed layers 114p and 114n are oriented in the +Z or −Z direction, the charge current passing through the Giant Spin Hall metal 130 may flip the magnetic moments of the free layers 112p and 112n in the +/−Z and −/+Z direction, respectively. A charge current passing through the Giant Spin Hall metal 130 in the opposite direction (e.g., along the −X direction) may cause the cause the magnetic moments of the free layer 112p/112n to flip (e.g., change from the +/−Z direction to the −/+Z direction). Here, the fixed layer 114p/114n has strong magnetic polarization and acts as a point of reference for magnetic polarization (or magnetic moments).

According to some embodiments, the first and second fixed layers 114p and 114n have magnetic orientations that are in the same or substantially the same direction (e.g., the +Z direction), and the charge current +Jc in the first direction (e.g., the +Xd direction) causes the magnetic orientations of the first free layer 112p and the first fixed layer 114p to be parallel and those of the second free layer 112n and the second fixed layer to be anti-parallel. Thus, as illustrated in FIG. 2, the first STT stack 111p exhibits a parallel configuration, while the second STT stack 111n exhibits an anti-parallel configuration. According to some examples, the parallel configuration of the first STT stack 111p may represent the storage of a binary '1' state, and the anti-parallel configuration of the second STT stack 111n may represent the storage of a binary '0' state. However, embodiments of the present invention are not limited thereto, and the parallel and anti-parallel magnetic orientations may represent a binary '0' state and a binary '1' state, respectively. Accordingly, the charge current +Jc flowing through the Giant Spin Hall metal 130 may induce the CGSHL 110 to concurrently (e.g., simultaneously) store complementary states '1' and '0' (or '0' and '1', if charge current direction is reversed) in the first and second STT stacks 111p and 111n, respectively.

The antiparallel configuration makes the corresponding stack (e.g., the first STT stack 111p in FIG. 2) more resistive, while the parallel configuration makes its corresponding stack (e.g., the second STT stack) 111n less resistive. In some embodiments, the data retention circuits 100 utilizes this difference in resistance to perform a differential read of the stored bits during a read operation. According to some examples, in an artificial intelligence system (or a neuromorphic system), the read operation may represent the inference phase of operation, during which data (e.g., weights/weight components) stored at the nodes/cells are used to perform a calculation (e.g., a linear mathematical operation) on an input value from a previous node/cell to generate an output value to pass onto a successive node/cell.

Figures 3A, 3B:
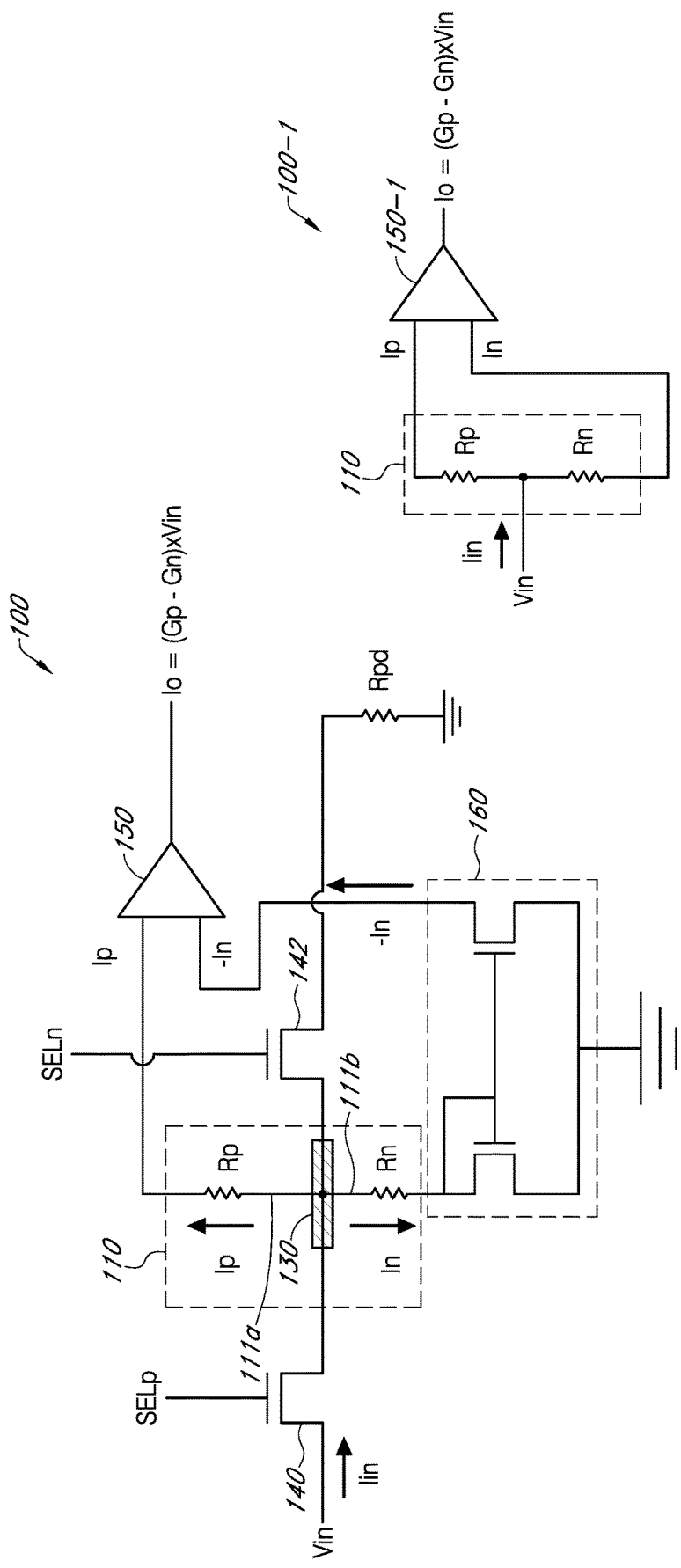
FIG. 3A illustrates a schematic diagram of a non-volatile data retention circuit, according to some example embodiments of the present invention.
FIG. 3B illustrates a simplified schematic diagram of a non-volatile data retention circuit, according to some other example embodiments of the present invention.

FIG. 3A illustrates a schematic diagram of a non-volatile data retention circuit 100 according to some example embodiments of the present invention. FIG. 3B illustrates a simplified schematic diagram of a non-volatile data retention circuit 100 according to some other example embodiments of the present invention.

Referring to FIG. 3A, according to some embodiments, the non-volatile data retention circuit 100 includes a complementary latch 110, first and second selection transistors 140 and 142, a differential amplifier (e.g., a current sense amplifier) 150, and a current mirror 160. The complementary latch 110 exhibits different resistances at its first and second STT stacks 111p and 111n when storing complementary data. The first and second selection transistors 140 and 142 are coupled to opposite ends of the Giant Spin Hall metal 130 and are configured to control the operational mode (e.g., idle/read/write mode) of the complementary latch 110 based on the first and second selection signals SELp and SELn. A first input of the differential amplifier 150 is electrically connected to the first STT stack 111p of the complementary latch 110, and a second input of the differential amplifier 150 is electrically connected to the current mirror 160, which is electrically connected between the differential amplifier 150 and the second STT stack 111n of the complementary latch 110. The differential amplifier 150 is configured to sense (e.g., amplify) a difference in charge current passing through the first and second STT stacks 111p and 111n, when in write mode. The current mirror 160 is configured to apply a mirrored current (e.g., a reverse current) of a charge current flowing through the second STT stack 111n to the second input of the differential amplifier 150. The first and second selection transistors 140 and 142 receive the first and second selection signals SELp and SELn, respectively, at their gates.

When in idle mode, both of the selection signals SELp and SELn are disable (e.g., not supplied), which deactivates (e.g., turns off) both of first and second selection transistors 140 and prevents any current flow through the Giant Spin Hall metal 130 and the first and second STT stacks 111p and 111n. In idle mode, no data can be written to, or read from, the data retention circuit 100.

In data write mode, when both of the first and second selection transistors 140 and 142 are activated (e.g., turned on) by virtue of receiving the selection signals SELp and SELn at their gates, the selection transistors 140 and 142 form a current path from the input of the data retention circuit 100 (where the input signal Vin is received) through the Giant Spin Hall metal 130 and to a pull down impedance Rpd. The passage of charge current through the Giant Spin Hall metal 130 induces spin currents that store complementary bits in the first and second STT stacks 111p and 111n and results in a higher resistance in one STT stack than the other. In the example illustrated in FIG. 3A, the first STT stack exhibits a lower resistance Rp (i.e., has a parallel configuration) and the second STT stack exhibits a higher resistance Rn (i.e., has an anti-parallel configuration).

In read mode, the first selection signal SELp is applied to the first selection transistor 140, thus activating (turning on) the first selection transistor 140, while the second selection transistor 142 is deactivated (disabled or turned off) by virtue of the second selection signal SELn not being applied to the second selection transistor 142. Here, input current to the Giant Spin Hall metal 130 is split into a first current Ip passing through the first STT stack 111p and a second current In passing through the second STT stack 111n. The ratio of the first and second currents Ip and In may be inversely proportional to the ratio of the first and second resistances Rp and Rn. Thus, in the example of FIG. 3A, the first current Ip may have a higher value than the second current In. This current differential is detected by the amplifier 150, which generate an output current that is proportional to the difference. The output current Io of the differential amplifier 150 of the data retention circuit 100 may be expressed through Equation 1:

$$Io=(Gp-Gn)\times Vin \qquad \text{Equation 1}$$

Where Gp and Gn represent the conductance (i.e., the inverse of resistance) of the first and second STT stacks 111p and 111n, respectively.

Here, the current mirror 160 serves to change the polarity of the second current In at the input of the differential amplifier 150 (to −Ib). While the example illustrated in FIG. 3A utilizes a Wilson current mirror, embodiments of the present invention are not limited thereto, and the current mirror 160 may utilize any suitable current mirror circuit topology (e.g., the Wilson current mirror topology). Further, while the embodiments of the data retention circuit 100 illustrated in FIG. 3A utilize a current mirror 160, embodiments of the present invention are not limited thereto. For example, the current mirror 160 may be eliminated if the inversing of the current polarity occurs internal at either input of the differential amplifier.

FIG. 3B illustrates embodiments of the present invention, where the operation of the current mirror has been integrated into the differential amplifier 150-1, such that the second input of the differential amplifier 150-1 is directly connected to the second STT stack 111n (i.e., without the intervening current mirror) and receives the second current In during the read mode. For sake of clarity of illustration, elements such as the Giant Spin Hall metal 130, the first and second selection transistors 140 and 142 and the corresponding first and second selection signals SELp and SELn are not shown in FIG. 3B.

FIGS. 3A and 3B illustrate some embodiments of the present invention in which each data retention circuit 100/100-1 has its dedicated differential amplifier 150/150-1 (and, in some examples, a dedicated current mirror). However, embodiments of present invention are not limited thereto.

Figure 4:
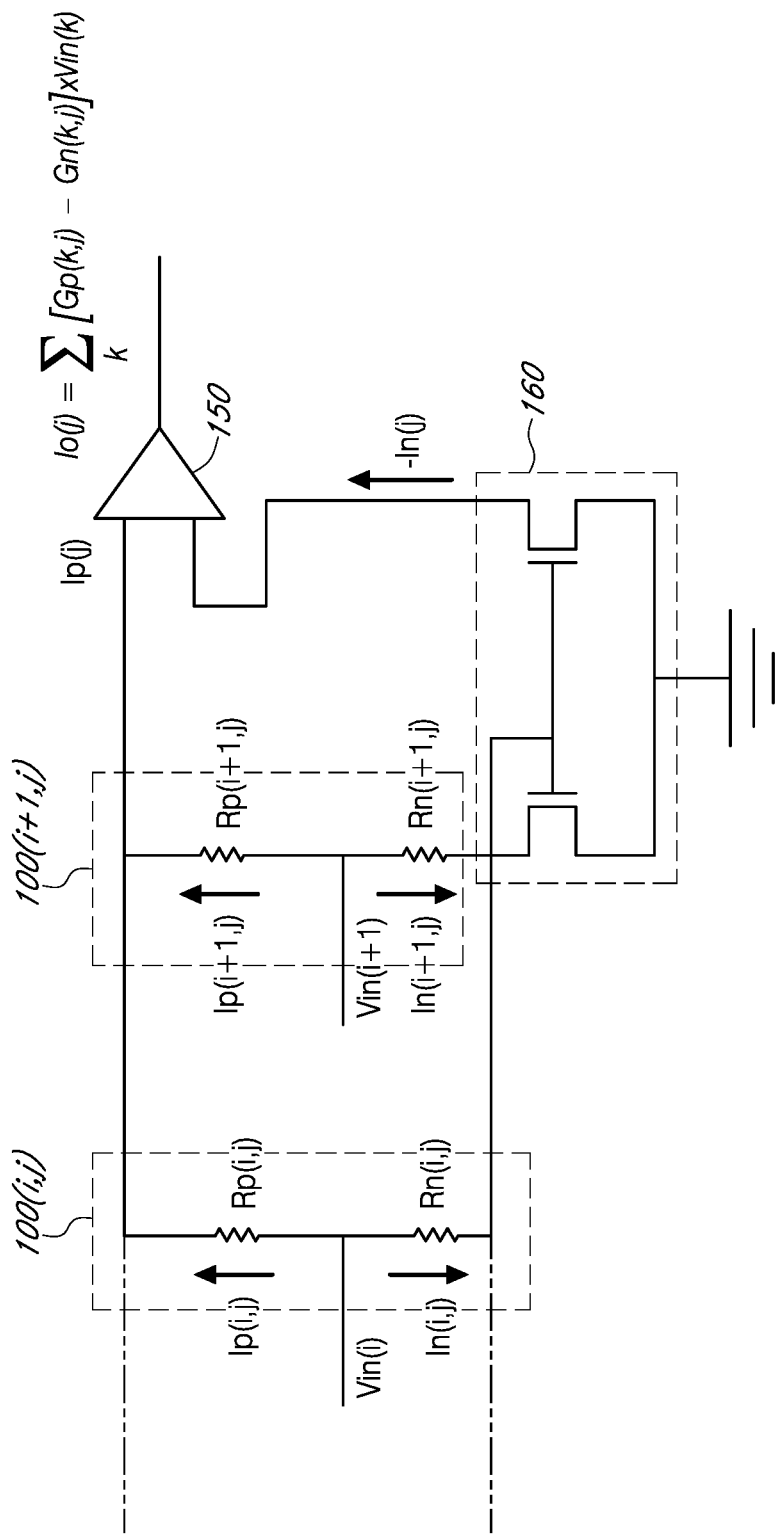
FIG. 4 illustrates a schematic diagram of one column of data retention circuits in a data processing system, according to some example embodiments of the present invention.

FIG. 4 illustrates a schematic diagram of one column of data retention circuits 100 in a data processing system 10, according to some example embodiments of the present invention. For sake of clarity of illustration, elements such as the Giant Spin Hall metal 130, the first and second selection transistors 140 and 142 and the corresponding first and second selection signals SELp and SELn are not shown in FIG. 4.

Referring to FIG. 4, in some embodiments, the data retention circuits 100 arranged in one column, which have their outputs electrically coupled to one another, share a common differential amplifier 150. In embodiments in which the differential amplifier 150 utilizes a current mirror 160 at one of its inputs, the column of data retention circuits 100 also share a common current mirror 160. When the differential amplifier 150-1 (shown in FIG. 3B) is utilized, the current mirror 160 may be removed and the second input of the differential amplifier 150-1 may be connected (e.g., directly connected) to the second STT stacks 111p of data retention circuits 100.

In some embodiments, the column of data retention circuits 100 have their corresponding first STT stacks 111p electrically connected to one another (by, e.g., sharing a common first bitline) and to a first input of the differential amplifier, and have their corresponding second STT stacks 111n electrically connected to one another (by, e.g., sharing a common second bitline) and to a second input of the differential amplifier. In this manner, the first input of the differential amplifier 150 receives the summation of first currents (e.g., Ip(i,j), Ip(i+1,j), etc.) from the first STT stacks of the column of data retention circuits 100, and the second input of the differential amplifier 150 receives the summation of second currents (e.g., In(i,j), In(i+1,j), etc.) from the second STT stacks of the column of data retention circuits 100. The output current Io(j) of the differential amplifier 150 of a (j)th column of data retention circuits 100 may be expressed through Equation 2:

$$Io(j)=\Sigma_k[(Gp(k,j)-Gn(k,j))\times Vin(k)] \qquad \text{Equation 2}$$

Where Gp(k,j) and Gn(k,j) represent the conductance (i.e., the inverse of resistance) of the first and second STT stacks, respectively, of a (k)th row and (j)th column data retention circuits 100(k,j).

Sharing a common differential amplifier 150 (and a common current mirror) may result in substantial area and power consumption savings and reduce overall manufacturing costs.

Accordingly, as described above, embodiments of the present invention realize both differential weights (Rp and Rn) in a single unit cell (of, e.g., a neuromorphic system), thus reducing or minimizing area taken up by the differential weights, and providing a high noise margin differential read due to paired bit storage. According to some embodiments, the data retention circuit 100 is stackable in three dimensions, which may enable very large data storage (e.g., in the gigabyte range). Embodiments of the present invention may also be embedded in a logic process due to the relatively low voltages used. Additionally, no external magnetic fields are required in this structure, thus reducing overhead of creating external magnetic fields.

Figure 5:
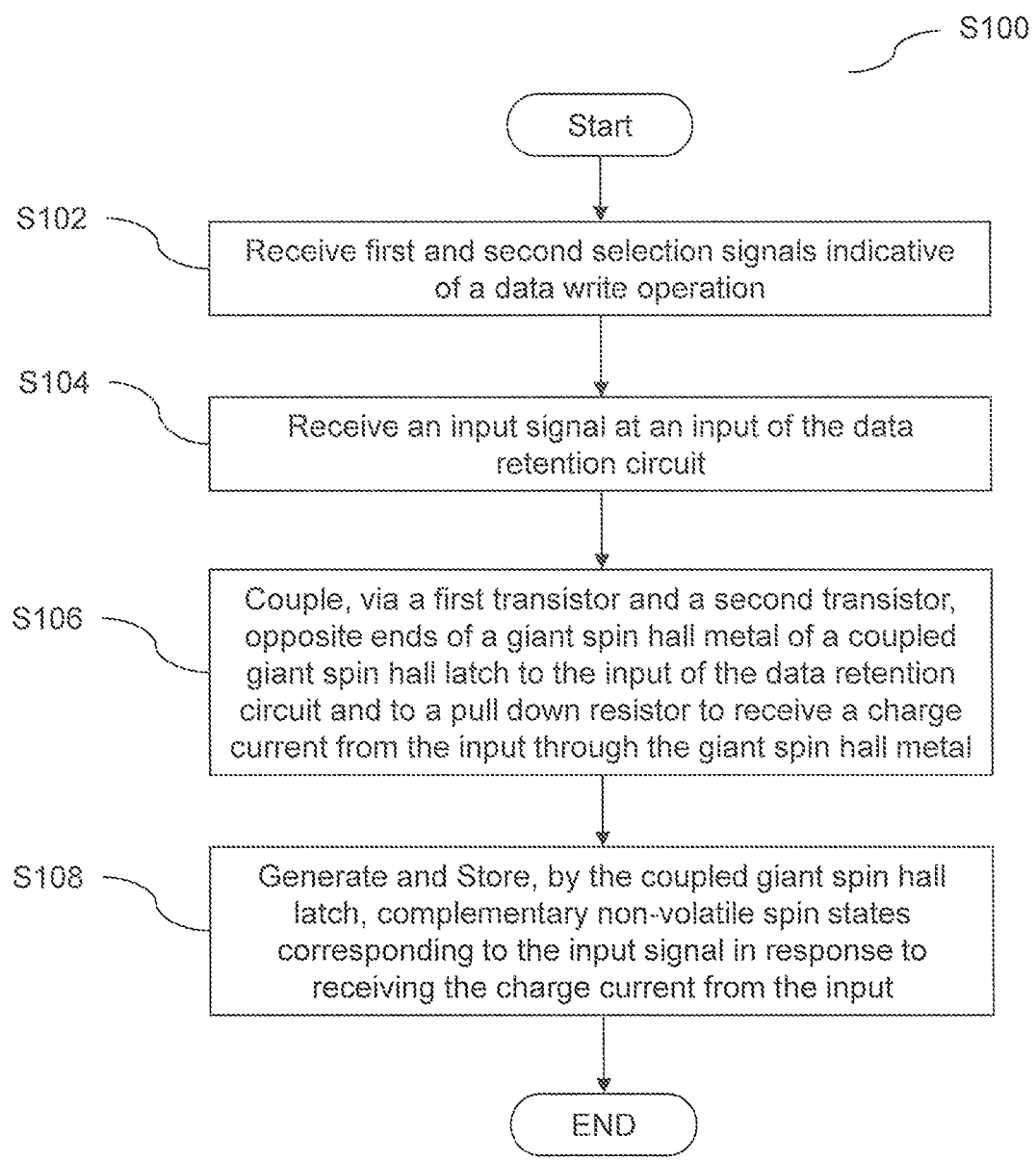
FIG. 5 is a flow diagram illustrating a process of writing complementary data to the data retention circuit, according to some example embodiments of the present invention.

FIG. 5 is a flow diagram illustrating a process S100 of writing complementary data to the data retention circuit 100, according to some example embodiments of the present invention.

Referring to FIG. 5, the data retention circuit 100 may receive a first selection signal SELp and a second selection signal SELn, which are indicative of a data write operation (S102). In response to receiving the first and second selection signals SELp and SELn, the data retention circuit 100 may receive an input signal at its input (S104), couple, via the first and second selection transistors (also referred to as first and second transistors) 140 and 142, opposite ends of the Giant Spin Hall metal 130 of the coupled giant spin hall latch 110 to the input of the data retention circuit 100 and to a pull down resistor Rpd to receive a charge current from the input through the Giant Spin Hall metal 130 (S106). The data retention circuit 100 may then generate and store, by the coupled giant spin hall latch, complementary non-volatile spin states corresponding to the input signal in response to receiving the charge current from the input (S108).

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on," "connected to," "coupled to," or "adjacent" another element or layer, it can be directly on, connected to, coupled to, or adjacent the other element or layer, or one or more intervening elements or layers may be present. When an element or layer is referred to as being "directly on," "directly connected to," "directly coupled to," or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A non-volatile data retention circuit comprising:
   a complementary latch configured to generate and store complementary non-volatile spin states corresponding to an input signal when in a write mode, and to concurrently generate a first charge current and a second charge current corresponding to the complementary non-volatile spin states when in a read mode;
   a differential amplifier coupled to the complementary latch and comprising a current mirror configured to receive the second charge current and to generate a reverse current having a polarity that is the reverse of that of the second charge current, the differential amplifier being configured to generate an output signal based on the first charge current and the reverse current.

2. The non-volatile data retention circuit of claim 1, wherein the differential amplifier comprises a current sense amplifier.

3. The non-volatile data retention circuit of claim 1, wherein the complementary latch comprises:
   a giant spin hall metal configured to pass through a charge current corresponding to the input signal;
   a first spin transfer torque (STT) stack at a first side of the giant spin hall metal; and
   a second STT stack at a second side of the giant spin hall metal opposite to the first side,
   wherein the first and second STT stacks extend along a direction orthogonal to an extension direction of the giant spin hall metal, and are configured to generate and store the complementary non-volatile spin states.

4. The non-volatile data retention circuit of claim 3, wherein, in response to the charge current flowing through the giant spin hall metal, the first STT stack is configured to exhibit magnetic moments having a parallel configuration, and the second STT stack is configured to exhibit magnetic moments having an anti-parallel configuration.

5. The non-volatile data retention circuit of claim 4, wherein the first and second STT stacks are configured to maintain their parallel and anti-parallel configurations even when no power is provided to the non-volatile data retention circuit.

6. The non-volatile data retention circuit of claim 4, wherein the parallel configuration of the first STT stack and the anti-parallel configuration of the second STT stack correspond to storage of the complementary non-volatile spin states at the first and second STT stacks.

7. The non-volatile data retention circuit of claim 3, wherein the giant spin hall metal comprises beta tantalum, platinum, and/or copper bismuth.

8. The non-volatile data retention circuit of claim 3, wherein each of the first and second STT stacks comprise:
   a free layer comprising magnetic material and configured to respond to a spin current corresponding to the charge current flowing through the giant spin hall metal based on a giant spin hall effect, and to exhibit a free magnetic moment substantially orthogonal in direction to the spin current;
   a fixed layer comprising magnetic material and exhibiting a fixed magnetic moment unaffected by stray fields resulting from the charge current flowing through the giant spin hall metal; and
   a non-magnetic layer between the free and fixed layers and configured to magnetically isolate the free magnetic moment of the free layer from the fixed magnetic moment of the fixed layer and to maintain any existing difference in directionality of the free and fixed magnetic moments.

9. The non-volatile data retention circuit of claim 8, wherein, in response to the charge current flowing through the giant spin hall metal, the free layer of the first STT stack is configured to exhibit a first free magnetic moment parallel with the fixed magnetic moment of the corresponding fixed layer, and the free layer of the second STT stack is configured to exhibit a second free magnetic moment anti-parallel with the fixed magnetic moment of the corresponding fixed layer.

10. The non-volatile data retention circuit of claim 3, further comprising:
   a first transistor coupled to the giant spin hall metal and configured to activate in response to a first selection signal; and
   a second transistor coupled to the giant spin hall metal and configured to activate in response to a second selection signal,
   wherein, when in the write mode, the first and second transistors are configured to activate and to enable flow of the charge current through the giant spin hall metal in response to the first and second selection signals, and
   wherein, when in the read mode, the second transistor is configured to deactivate, and the first transistor is configured to activate and to enable flow of a first charge current through the first STT stack and a second charge current through the second STT stack in response to the first selection signal.

11. The non-volatile data retention circuit of claim 10, wherein the first and second transistors are coupled to opposite ends of the giant spin hall metal, and
   wherein the second transistor is configured to electrically couple the giant spin hall metal to a pull down resistor in response to the second selection signal.

12. The non-volatile data retention circuit of claim 4, wherein the differential amplifier comprises a first input configured to receive a first charge current from the first STT stack, and a second input configured to receive a second charge current from the second STT stack.

13. The non-volatile data retention circuit of claim 1, wherein the complementary latch is configured to continue storing the complementary non-volatile spin states even when no electrical power is provided to the non-volatile data retention circuit.

14. The non-volatile data retention circuit of claim 1, wherein the differential amplifier is directly coupled to opposite ends of the complementary latch through first and second bits lines and configured to receive the first and second charge currents through the first and second bits lines.

15. A data processing system comprising:
   a first complementary latch configured to generate and store first complementary non-volatile spin states corresponding to a first input signal when in a write mode, and to concurrently generate a first charge current and a second charge current corresponding to the first complementary non-volatile spin states when in a read mode;
   a second complementary latch configured to generate and store second complementary non-volatile spin states corresponding to a second input signal when in the write mode, and to concurrently generate a third charge current and a fourth charge current corresponding to the second complementary non-volatile spin states when in the read mode;
   a differential amplifier coupled to the first and second complementary latches and comprising a current mirror configured to receive the second and fourth charge currents and to generate a reverse current having a polarity that is the reverse of that of the second and fourth charge currents, the differential amplifier being configured to generate an output signal based on the first to fourth charge currents.

16. The data processing system of claim 15, wherein a first input of the differential amplifier is configured to receive a sum of the first and third charge currents from the first and second complementary latches.

17. The data processing system of claim 15, wherein the reverse current corresponds to a sum of the second and fourth charge currents.

18. The data processing system of claim 15, wherein the first complementary latch comprises:
   a giant spin hall metal configured to pass through a charge current corresponding to the input signal;
   a first spin transfer torque (STT) stack at a first side of the giant spin hall metal; and
   a second STT stack at a second side of the giant spin hall metal opposite to the first side,
   wherein the first and second STT stacks extend along a direction orthogonal to an extension direction of the giant spin hall metal, and are configured to generate and store the complementary non-volatile spin states.

19. The data processing system of claim 18, wherein, in response to the charge current flowing through the giant spin hall metal, the first STT stack is configured to exhibit magnetic moments having a parallel configuration, and the second STT stack is configured to exhibit magnetic moments having an anti-parallel configuration.

20. The data processing system of claim 18, wherein the first and second STT stacks are configured to maintain their parallel and anti-parallel configurations even when no power is provided to the data processing system.

* * * * *